United States Patent
Yu et al.

(10) Patent No.: US 11,158,512 B2
(45) Date of Patent: Oct. 26, 2021

(54) FIN FIELD EFFECT TRANSISTOR (FINFET) DEVICE STRUCTURE

(71) Applicant: Taiwan Semiconductor Manufacturing Co., Ltd., Hsinchu (TW)

(72) Inventors: Jia-Ni Yu, New Taipei (TW); Zhi-Chang Lin, Zhubei (TW); Wei-Hao Wu, Hsinchu (TW); Huan-Chieh Su, Changhua County (TW); Chung-Wei Hsu, Hsinchu County (TW); Chih-Hao Wang, Hsinchu County (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/895,464

(22) Filed: Jun. 8, 2020

(65) Prior Publication Data
US 2020/0303194 A1   Sep. 24, 2020

Related U.S. Application Data

(63) Continuation of application No. 16/210,641, filed on Dec. 5, 2018, now Pat. No. 10,679,856.

(60) Provisional application No. 62/718,817, filed on Aug. 14, 2018.

(51) Int. Cl.
*H01L 21/28* (2006.01)
*H01L 21/762* (2006.01)
*H01L 29/40* (2006.01)
*H01L 29/66* (2006.01)
*H01L 21/768* (2006.01)
*H01L 29/78* (2006.01)

(52) U.S. Cl.
CPC .. *H01L 21/28123* (2013.01); *H01L 21/28247* (2013.01); *H01L 21/76224* (2013.01); *H01L 21/76897* (2013.01); *H01L 29/401* (2013.01); *H01L 29/66795* (2013.01); *H01L 29/7851* (2013.01)

(58) Field of Classification Search
CPC ......... H01L 29/66795; H01L 21/28123; H01L 21/76897; H01L 21/28247; H01L 29/66553; H01L 29/7848
See application file for complete search history.

(56) References Cited

U.S. PATENT DOCUMENTS

| | | | |
|---|---|---|---|
| 8,772,109 B2 | 7/2014 | Colinge |
| 8,785,285 B2 | 7/2014 | Tsai et al. |
| 8,816,444 B2 | 8/2014 | Wann et al. |
| 8,823,065 B2 | 9/2014 | Wang et al. |
| 8,860,148 B2 | 10/2014 | Hu et al. |
| 9,105,490 B2 | 8/2015 | Wang et al. |
| 9,236,267 B2 | 1/2016 | De et al. |

(Continued)

*Primary Examiner* — Changhyun Yi
(74) *Attorney, Agent, or Firm* — Birch, Stewart, Kolasch & Birch, LLP

(57) ABSTRACT

A FinFET device structure is provided. The FinFET device structure includes a substrate, a fin structure formed over the substrate, and an isolation structure formed over the substrate. The fin structure protrudes from the isolation structure. The FinFET device structure further includes a fin isolation structure formed over the isolation structure and a metal gate structure formed over the fin structure and the fin isolation structure.

20 Claims, 12 Drawing Sheets

(56) References Cited

U.S. PATENT DOCUMENTS

| | | | |
|---|---|---|---|
| 9,236,300 B2 | 1/2016 | Liaw | |
| 9,520,482 B1 | 12/2016 | Chang et al. | |
| 9,576,814 B2 | 2/2017 | Wu et al. | |
| 10,679,856 B2* | 6/2020 | Yu | H01L 29/66795 |
| 2014/0110755 A1 | 4/2014 | Colinge | |
| 2015/0021710 A1* | 1/2015 | Hsu | H01L 21/76224 |
| | | | 257/401 |
| 2015/0255456 A1 | 9/2015 | Jacob et al. | |
| 2016/0141179 A1* | 5/2016 | Wu | H01L 21/76843 |
| | | | 257/288 |

* cited by examiner

FIN FIELD EFFECT TRANSISTOR (FINFET) DEVICE STRUCTURE

CROSS REFERENCE TO RELATED APPLICATIONS

This Application is a continuation of application Ser. No. 16/210,641, filed on Dec. 5, 2018, which claims the benefit of U.S. Provisional Application No. 62/718,817 filed on Aug. 14, 2018, and entitled "Fin field effect transistor (FinFET) device structure and method for forming the same", the entirety of which are incorporated by reference herein.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, for example, or in other types of packaging.

As the semiconductor industry has progressed into nanometer technology process nodes in pursuit of higher device density, higher performance, and lower costs, challenges from both fabrication and design issues have resulted in the development of three-dimensional designs, such as the fin field effect transistor (FinFET). FinFETs are fabricated with a thin vertical "fin" (or fin structure) extending from a substrate. The channel of the FinFET is formed in this vertical fin. A gate is provided over the fin. The advantages of a FinFET may include reducing the short channel effect and providing a higher current flow.

Although existing FinFET devices and methods of fabricating FinFET devices have generally been adequate for their intended purposes, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
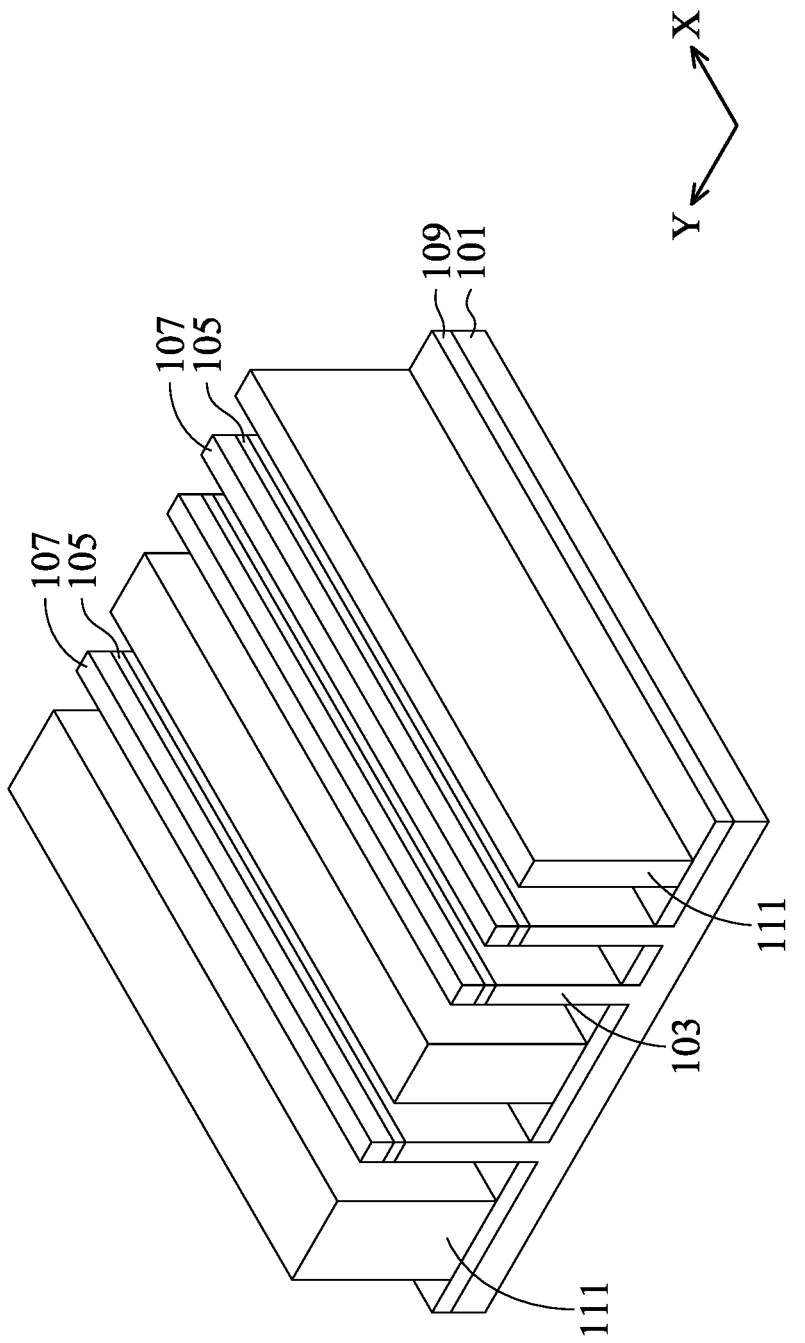
FIGS. 1A-1J are perspective representations of various stages of forming a FinFET device structure, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and after the method, and some of the operations described can be replaced or eliminated for other embodiments of the method.

Fin structures described below may be patterned by any suitable method. For example, the fin structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fin structures.

Embodiments for forming a fin field effect transistor (FinFET) device structure are provided. The method for forming the FinFET device structure may include patterning a metal stack and a dielectric material over the metal stack to form a metal gate structure and an insulating structure over the metal gate structure. Since the metal stack and the dielectric material are patterned in a single patterning process, the metal gate structure and the insulating structure, which is used as a mask preventing the metal gate structure from being etched during the etching process for forming the S/D contact, may be formed at the same time.

FIGS. 1A-1J are perspective representations of various stages of forming a FinFET device structure 100, in accordance with some embodiments of the disclosure.

A substrate 101 is provided, as shown in FIG. 1A in accordance with some embodiments. The substrate 101 may be a semiconductor wafer such as a silicon wafer. Alternatively or additionally, the substrate 101 may include elementary semiconductor materials, compound semiconductor materials, and/or alloy semiconductor materials. Examples of the elementary semiconductor materials may include, but are not limited to, crystal silicon, polycrystalline silicon, amorphous silicon, germanium, and/or diamond. Examples of the compound semiconductor materials may include, but are not limited to, silicon carbide, gallium arsenic, gallium phosphide, indium phosphide, indium arsenide, and/or indium antimonide. Examples of the alloy semiconductor materials may include, but are not limited to, SiGe, GaAsP, AlInAs, AlGaAs, GaInAs, GaInP, and/or GaInAsP. In some embodiments, the substrate 101 includes an epitaxial layer. For example, the substrate 101 has an epitaxial layer overlying a bulk semiconductor.

Afterwards, an etching process is performed on the substrate 101 to form fin structures 103 by using a patterned dielectric layer 105 and a patterned mask layer 107 as a mask, as shown in FIG. 1A in accordance with some embodiments. The method for forming the patterned dielectric layer 105 and the patterned mask layer 107 includes forming a dielectric layer (not shown) and a mask layer (not shown) over the substrate 101, and forming a patterned photoresist layer (not shown) over the mask layer. Then, the dielectric layer and the mask layer are patterned by using the patterned photoresist layer as a mask. As a result, the patterned dielectric layer 105 and the patterned mask layer 107 are obtained.

The dielectric layer may be used as an etch stop layer when the mask layer is patterned. The dielectric layer may also be used as an adhesion layer that is formed between the substrate 101 and the mask layer. In some embodiments, the dielectric layer may be made of silicon oxide. The mask layer may be made of silicon oxide, silicon nitride, silicon oxynitride, or another applicable material.

In some other embodiments, more than one mask layer is formed over the dielectric layer. Moreover, the dielectric layer and the mask layer may be formed by deposition processes, which may include a chemical vapor deposition (CVD) process, a high-density plasma chemical vapor deposition (HDPCVD) process, a spin-on process, a sputtering process, or another applicable process.

The patterned photoresist layer may be formed by a deposition process and a patterning process. The deposition process for forming the patterned photoresist layer may include a chemical vapor deposition (CVD) process, a high-density plasma chemical vapor deposition (HDPCVD) process, a spin-on process, a sputtering process, or another applicable process. The patterning process for forming the patterned photoresist layer may include a photolithography process and an etching process. The photolithography process may include photoresist coating (e.g., spin-on coating), soft baking, mask aligning, exposure, post-exposure baking, developing the photoresist, rinsing and drying (e.g., hard baking). The etching process may include a dry etching process or a wet etching process.

Afterwards, the patterned photoresist layer is removed, and an etching process is performed on the substrate 101 to form the fin structures 103 by using the patterned dielectric layer 105 and the patterned mask layer 107 as a mask. The etching process may be a dry etching process or a wet etching process.

In some embodiments, the substrate 101 is etched by a dry etching process. The dry etching process includes using a fluorine-based etchant gas, such as $SF_6$, $C_xF_y$, $NF_3$ or a combination thereof. The etching process may be a time-controlled process, and continue until the fin structures 103 reaches a predetermined height. In some other embodiments, the fin structures 103 have a width that gradually increases from the upper portion to the lower portion.

After the fin structures 103 are formed, an isolation structure 109 is formed to surround the fin structures 103. The method for forming the isolation structure 109 includes forming an insulating layer (not shown) to cover the fin structures 103, the patterned dielectric layer 105 and the patterned mask layer 107 over the substrate 101, and thinning or planarizing the insulating layer to expose the top surface of the patterned mask layer 107.

In some embodiments, the insulating layer is made of silicon oxide, silicon nitride, silicon oxynitride, fluoride-doped silicate glass (FSG), or another low-k dielectric material. The insulating layer may be deposited by a chemical vapor deposition (CVD) process, a spin-on-glass process, or another applicable process. In some embodiments, after the insulating layer is formed, the insulating layer is thinned by a chemical mechanical polishing (CMP) process.

Afterwards, the insulating layer is further recessed to form the isolation structure 109. In some embodiments, the isolation structure 109 includes the remaining insulating layer and the insulating liner(s) (not shown) surrounding the remaining insulating layer. The isolation structure 109 may be a shallow trench isolation (STI) structure surrounding the fin structures 103.

In some embodiments, a portion of the fin structures 103 is embedded in the isolation structure 109. More specifically, a lower portion of the fin structures 103 is surrounded by the isolation structure 109, while an upper portion of the fin structures 103 protrudes from the isolation structure 109. The isolation structure 109 is configured to prevent electrical interference or crosstalk.

After the isolation structure 109 is formed, fin isolation structures 111 are formed over the isolation structure 109, as shown in FIG. 1A in accordance with some embodiments. Each of the fin isolation structures 111 has a strip shape that is similar to the shape of each of the fin structures 103. Therefore, the fin isolation structures 111 may be referred to as dummy fin structures or hybrid fin structures, and the fin structures 103 may be referred to as active fin structures.

The fin isolation structures 111 are separated from the substrate 101 by the isolation structure 109 and extend along a direction that is substantially parallel to the longitudinal direction of the fin structures 103. In some embodiments, the patterned dielectric layer 105 and the patterned mask layer 107 are not removed, and the distance between the top surface of the patterned mask layer 107 to the top surface of the isolation structure 109 is substantially the same as the distance between the top surface and the bottom surface of the fin isolation structures 111 (i.e. the height of the fin isolation structures 111).

In some embodiments, some of the fin isolation structures 111 serve as portions of insulating gate-cut structures and are made of a nitride-based material, such as silicon nitride, silicon oxynitride, or silicon carbon nitride, or the like. In some embodiments, the fin isolation structures 111 are made of a high-k dielectric material, such as metal oxide. Examples of high-k dielectric materials include hafnium oxide ($HfO_2$), hafnium silicon oxide (HfSiO), hafnium tantalum oxide (HfTaO), hafnium titanium oxide (HfTiO), hafnium zirconium oxide (HfZrO), zirconium oxide, titanium oxide, aluminum oxide, or other applicable dielectric materials. In some embodiments, the fin isolation structures 111 are formed by a chemical vapor deposition (CVD) process, a physical vapor deposition process (PVD), an atomic layer deposition (ALD) process, or another applicable process.

Figure 1B:
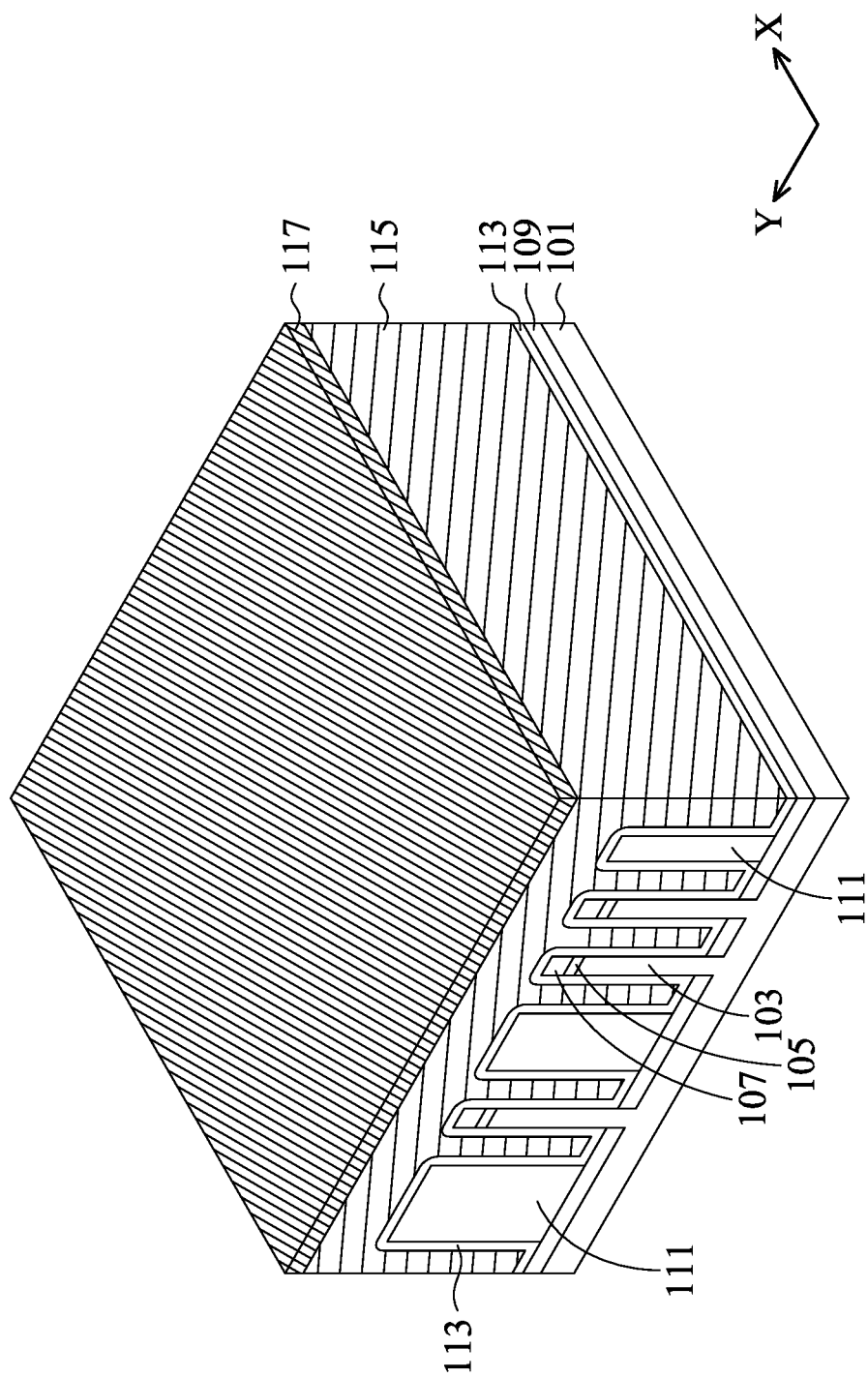

After the fin isolation structures 111 are formed, a high-k dielectric layer 113 is formed across the fin isolation structures 111 and the fin structures 103 and extends over the isolation structure 109, as shown in FIG. 1B in accordance with some embodiments. More specifically, the high-k dielectric layer 113 is conformally formed covering and in direct contact with the top surfaces and sidewalls of the fin isolation structures 111, the sidewalls of the fin structures 103 and the top surface of the isolation structure 109. In addition, the top surface and sidewalls of the patterned mask layer 107 and the sidewalls of the patterned dielectric layer 105 are in direct contact with the high-k dielectric layer 113.

The high-k dielectric layer 113 may be a single layer or multiple layers. In some embodiments, the high-k dielectric layer 113 is made of silicon oxide, silicon nitride, silicon oxynitride (SiON), dielectric material(s) with high dielectric constant (high-k), or a combination thereof. In some embodiments, the high-k dielectric layer 113 is deposited by a plasma enhanced chemical vapor deposition (PECVD) process or a spin coating process.

After the high-k dielectric layer 113 is formed, a metal stack 115 is formed over the high-k dielectric layer 113, as shown in FIG. 1B in accordance with some embodiments. In some embodiments, the metal stack 115 includes a work function layer (not shown) and a metal gate electrode layer (not shown). The work function layer is tuned to have a proper work function.

The work function layer of the metal stack 115 may be a single layer or multiple layers. In some embodiments, the work function layer is made of an N-type work function metal or a P-type work function metal. The N-type work function metals include tungsten (W), copper (Cu), titanium (Ti), silver (Ag), aluminum (Al), titanium aluminum alloy (TiAl), titanium aluminum nitride (TiAlN), titanium aluminum carbide (TiAlC), tantalum carbide (TaC), tantalum carbon nitride (TaCN), tantalum silicon nitride (TaSiN), manganese (Mn), zirconium (Zr), or a combination thereof. The P-type work function metals include titanium nitride (TiN), tungsten nitride (WN), tantalum nitride (TaN), ruthenium (Ru), or a combination thereof. In some embodiments, the work function layer is formed by atomic layer deposition (ALD), sputtering, physical vapor deposition (PVD), or another applicable process.

Moreover, the metal gate electrode layer is made of a conductive material such as tungsten (W), aluminum (Al), copper (Cu), titanium (Ti), tantalum (Ta), or another applicable material, in accordance with some embodiments. The metal gate electrode layer may be formed by a deposition process, such as a chemical vapor deposition (CVD) process, a physical vapor deposition (PVD) process, an atomic layer deposition (ALD) process, a high density plasma CVD (HDPCVD) process, a metal organic CVD (MOCVD) process, a plasma enhanced CVD (PECVD) process, or another applicable process.

In some other embodiments, the metal stack 115 further comprises a conformal barrier layer (not shown) formed between the high-k dielectric layer 113 and the work function layer. The barrier layer is employed to prevent the metal formed over it from penetrating into the channel region of the fin structures 103 below the metal gate structures formed subsequently. The barrier layer is made of metal nitride. Examples of the metal nitride include TiN, TaN, and WN. The barrier layer may be formed by physical vapor deposition (PVD), atomic layer deposition (ALD), or another applicable process.

After the metal stack 115 is formed, a metal cap layer 117 is formed over the metal stack 115. The metal cap layer 117 is made of tungsten (W). In some embodiments, the metal cap layer 117 is formed by chemical vapor deposition (CVD), high density plasma CVD (HDPCVD), metal organic CVD (MOCVD), plasma enhanced CVD (PECVD), or another applicable process.

Figure 1C:
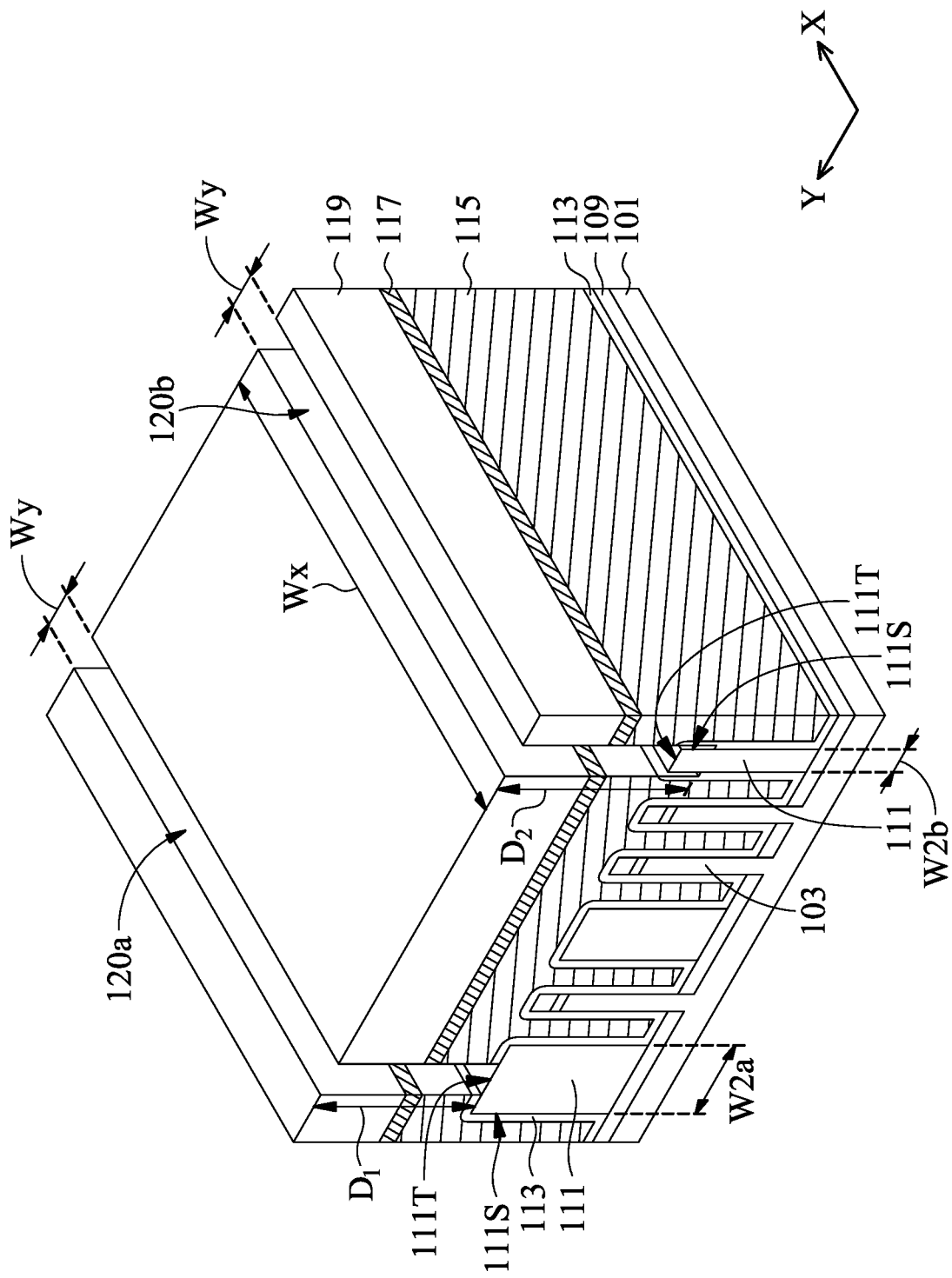

Afterwards, a patterned mask layer 119 is formed over the metal cap layer 117, and first openings 120a and 120b are formed penetrating through the metal cap layer 117, the metal stack 115 and the high-k dielectric layer 113 by using the patterned mask layer 119 as a mask, as shown in FIG. 1C in accordance with some embodiments. The patterned mask layer 119 may be a single layer or multiple layers.

In some embodiments, the patterned mask layer 119 is made of silicon oxide, silicon nitride, silicon oxynitride, silicon carbonitride (SiCN), SiOCN, $HfSi_xO_y$, $ZrSi_xO_y$, $AlSi_xO_y$, another applicable material, or a combination thereof. The patterned mask layer 119 may be formed by a deposition process and an etching process. The deposition process including a chemical vapor deposition (CVD) process, a physical vapor deposition (PVD) process, an atomic layer deposition (ALD) process, or another applicable process.

The patterned mask layer 119 is used as a mask for performing an etching process to form the first openings 120a and 120b. The etching process may be a dry etching process or a wet etching process. In some embodiments, the fin isolation structures 111 are used as etch stop layers when the metal cap layer 117, the metal stack 115 and the high-k dielectric layer 113 are patterned, such that the top surfaces 111T of the fin isolation structures 111 are exposed by the first openings 120a and 120b.

More specifically, each of the first openings 120a and 120b has a width Wx (also referred to as the first width) along the x-direction (i.e. the longitudinal direction of the fin structures 103), and each of the first openings 120a and 120b has a width Wy (also referred to as the second width) along the y-direction (i.e. the direction perpendicular to the longitudinal direction of the fin structure 103). In some embodiments, the width Wx is in a range from about 40 nm to about 10 μm, and the width Wy is in a range from about 5 nm to about 80 nm.

In some other embodiments, each of the first openings 120a and 120b has a top portion that is wider than its bottom portion. More specifically, each of the first openings 120a and 120b has inclined sidewalls. In these cases, the width Wy is defined as the bottommost width of each of the first openings 120a and 120b.

In addition, the fin isolation structures 111 may have different widths along the y-direction. For example, the fin isolation structures 111 may have two different widths W2a and W2b, as shown in FIG. 1C in accordance with some embodiments. Since the width W2b is smaller than the width W2a, the portion of the high-k dielectric layer 113 on the sidewalls of the fin isolation structures 111 having the width W2b is exposed while the top surfaces of the fin isolation structures 111 are exposed during the etching process, and the top portion of the high-k dielectric layer 113 on the sidewalls of the fin isolation structure 111 having the width W2b may be further etched. As a result, the depth $D_2$ of the first opening 120b is slightly greater than the depth $D_1$ of the first opening 120a.

In some embodiments, the width W2a and the width W2b of the fin isolation structures 111 both are in a range from about 3 nm to about 100 nm. In some embodiments, the depth $D_1$ is in a range from about 5 nm to about 100 nm, and the depth $D_2$ is also in a range from about 5 nm to about 100 nm. In some embodiments, the ratio ($D_1$/Wx) of the depth $D_1$ to the width Wx is in a range from about 0.0005 to about 2.5, and the ratio ($D_2$/Wx) of the depth $D_2$ to the width Wx is also in a range from about 0.0005 to about 2.5. In addition, the ratio ($D_1$/Wy) of the depth $D_1$ to the width Wy is in a range from about 0.0625 to about 20, and the ratio ($D_2$/Wy) of the depth $D_2$ to the width Wy is also in a range from about 0.0625 to about 20.

When the ratios ($D_1$/Wx), ($D_2$/Wx), ($D_1$/Wy) and ($D_2$/Wy) (i.e. the aspect ratios of the first openings 120a and 120b) are too large, it would be a big challenge to perform the etching process for forming the first openings 120a and 120b. When the ratios ($D_1$/Wx), ($D_2$/Wx), ($D_1$/Wy) and ($D_2$/Wy) (i.e. the aspect ratios of the first openings 120a and 120b) are too small, the strip-shaped dielectric portions 121a and 121b formed afterwards may extend over the fin structures 103. Since the fin structures 103 are active fin structures, the active regions of the FinFET device structure 100 (such as the channel regions under the metal gate structures 122 formed afterwards) may be reduced. As a result, the performance of the FinFET device structure 100 may be decreased undesirably.

Moreover, in some embodiments, if the width of the fin isolation structures 111 is greater than the width of the corresponding first opening (e.g. the width W2a of the isolation structures 111 is greater than the width Wy of the first opening 120a), the top surfaces 111T of the fin isolation structures 111 is partially exposed, while the sidewalls 111S of the fin isolation structures 111 remain covered by the high-k dielectric layer 113.

In some other embodiments, if the width of the fin isolation structures 111 is less than the width of the corresponding first opening (e.g. the width W2b of the isolation structure 111 is less than the width Wy of the first opening 120b), the top surface 111T of the fin isolation structures 111 is entirely exposed, while a portion of the sidewalls 111S of the fin isolation structures 111 is exposed.

Figure 1D:
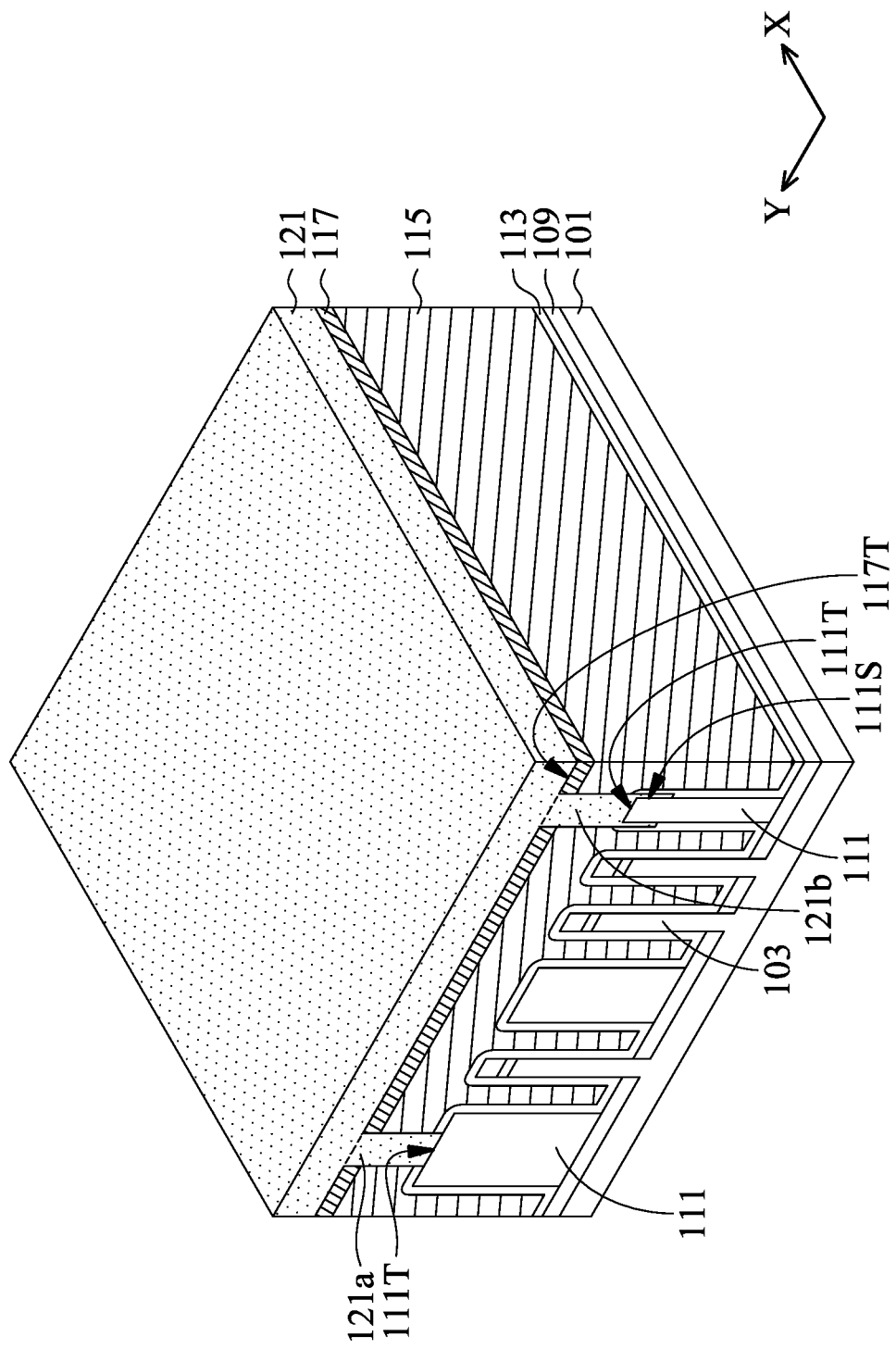

After the first openings 120a and 120b are formed, the patterned mask layer 119 is removed, and a dielectric material 121 is formed over the metal cap layer 117, as shown in FIG. 1D in accordance with some embodiments. It should be noted that, a portion of the dielectric material 121 is filled into the first openings 120a and 120b so as to form strip-shaped dielectric portions 121a and 121b.

More specifically, the strip-shaped dielectric portion 121a is in direct contact with the top surface 111T of the corresponding fin isolation structure 111, and the strip-shaped dielectric portion 121b is in direct contact with the top surface 111T and the sidewalls 111S of the corresponding fin isolation structure 111. In some embodiments, a portion of the strip-shaped dielectric portion 121b is sandwiched between the high-k dielectric layer 113 and the sidewalls 111S of the corresponding fin isolation structure 111. Therefore, it is ensured that the metal gate structures formed subsequently are isolated from each other by the fin isolation structures 111 and the insulating structure, which is formed by the strip-shaped dielectric portions 121a and 121b in the subsequent processes.

In some embodiments, the dielectric material 121 is made of silicon oxide, silicon nitride, silicon oxynitride (SiON), silicon carbonitride (SiCN), SiOCN, $HfSi_xO_y$, $ZrSi_xO_y$, $AlSi_xO_y$, another applicable material, or a combination thereof. The dielectric layer 121 may be formed by a deposition process, such as a chemical vapor deposition (CVD) process, a physical vapor deposition (PVD) process, an atomic layer deposition (ALD) process, a spin-on coating process, or another applicable process. Afterwards, a planarizing process may be performed. In some embodiments, the planarizing process includes a grinding process, a chemical mechanical polishing (CMP) process, another applicable process, or a combination thereof.

Figure 1E:
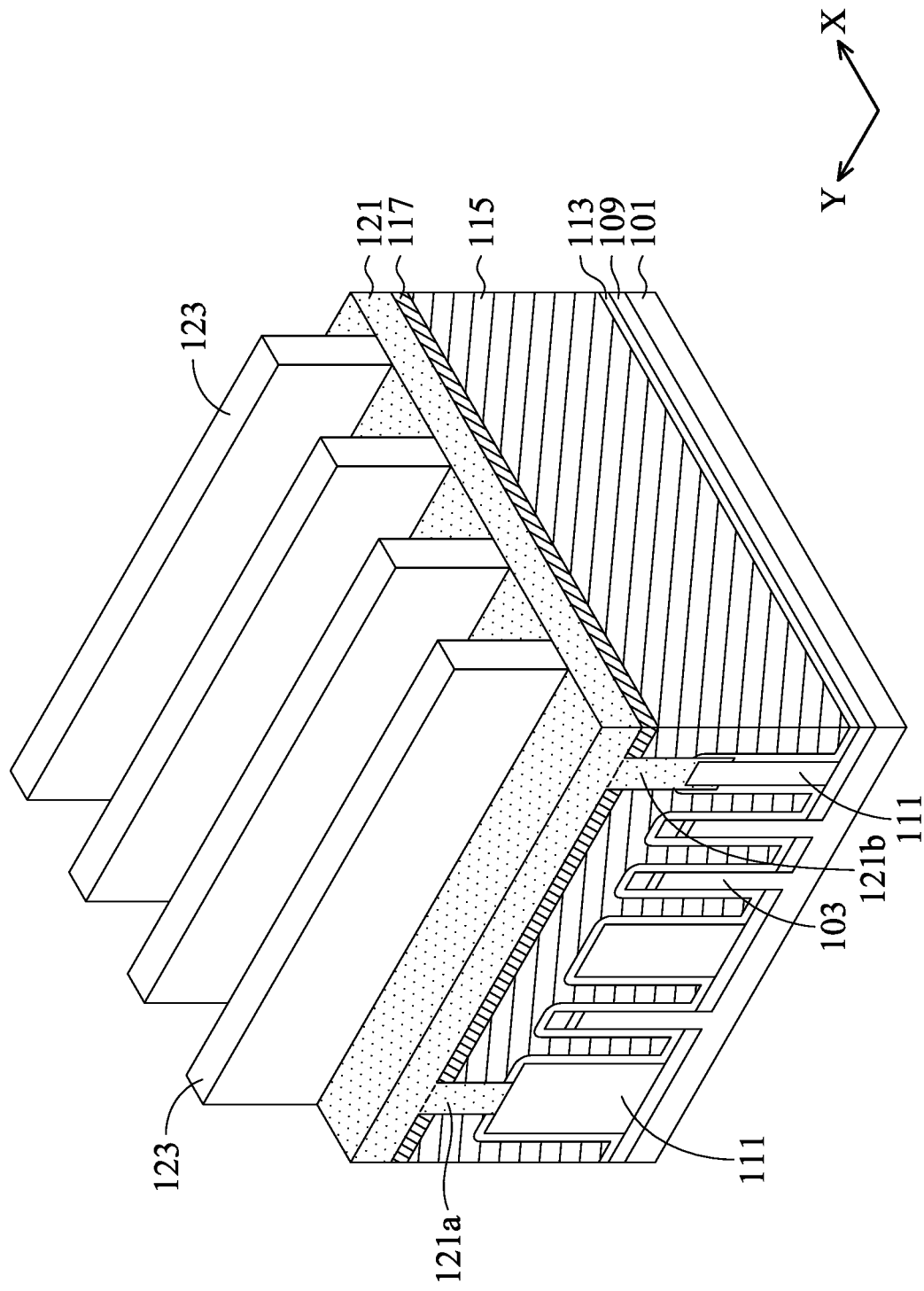

Afterwards, a patterned mask layer 123 is formed over the dielectric material 121, as shown in FIG. 1E in accordance with some embodiments. Some processes and materials used to form the patterned mask layer 123 are similar to, or the same as, those used to form the patterned mask layer 119 and are not repeated herein.

Figure 1F:
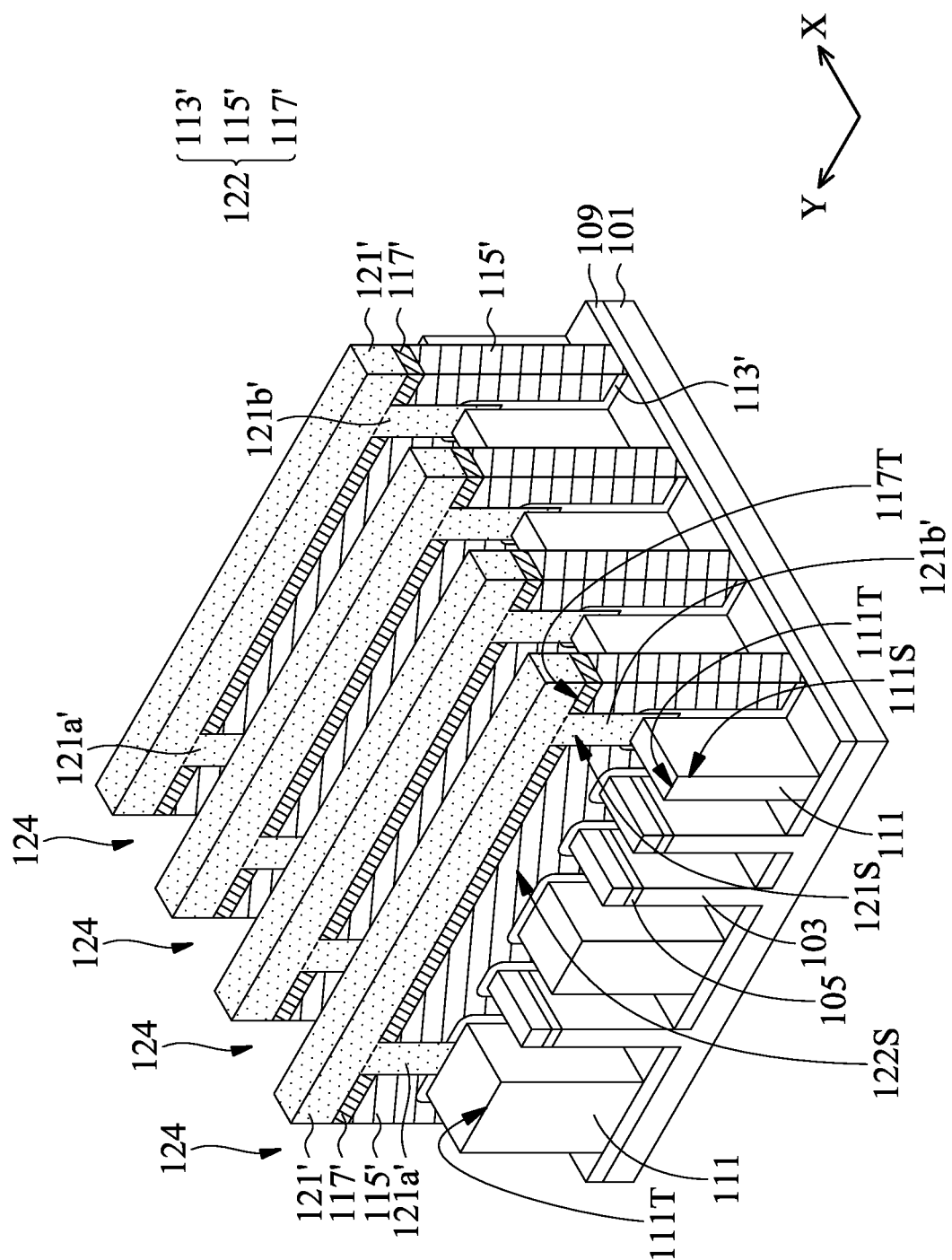

After the patterned mask layer 123 is formed, an etching process is performed on the high-k dielectric layer 113, the metal stack 115, the metal cap layer 117 and the dielectric layer 121 by using the patterned mask layer 123 as a mask, as shown in FIG. 1F in accordance with some embodiments. In some embodiments, second openings 124 are formed penetrating through the high-k dielectric layer 113, the metal stack 115, the metal cap layer 117 and the dielectric layer 121, such that the fin isolation structures 111, the patterned mask layer 107 over the fin structures 103 and the isolation structure 109 are exposed, and the patterned mask layer 123 is then removed. The etching process may include a dry etching process or a wet etching process.

More specifically, metal gate structures 122 are formed after the etching process. In some embodiments, the metal gate structures 122 include the remaining high-k dielectric layer 113', the remaining metal stack 115' and the remaining metal cap layer 117'. It should be noted that, an insulating structure 121' is formed from the dielectric material 121, and the insulating structure 121' includes extending portions 121a' and 121b' below the top surface 117T of the metal cap layer 117.

The extending portions 121a' are formed by the strip-shaped dielectric portion 121a, and the extending portions 121b' are formed by the strip-shaped dielectric portion 121b. In some embodiments, the extending portions 121a' and 121b' are in direct contact with the top surfaces 111T of the fin isolation structures 111. In some embodiments, a portion of the extending portions 121b' is sandwiched between the remaining high-k dielectric layer 113' and the fin isolation structures 111.

In some embodiments, each two of the metal gate structures 122 arranged along the x-direction and parallel to each other are separated by the second opening 124 between them. In some embodiments, the metal gate structures 122 arranged along the y-direction are separated by the corresponding extending portion 121a'/121b' and the corresponding fin isolation structure 111 between them. In addition, the patterned mask layer 107 and the patterned dielectric layer 105 remain above the fin structures 103, and the patterned mask layer 107 and the patterned dielectric layer 105 are exposed by the second openings 124.

Figure 1G:
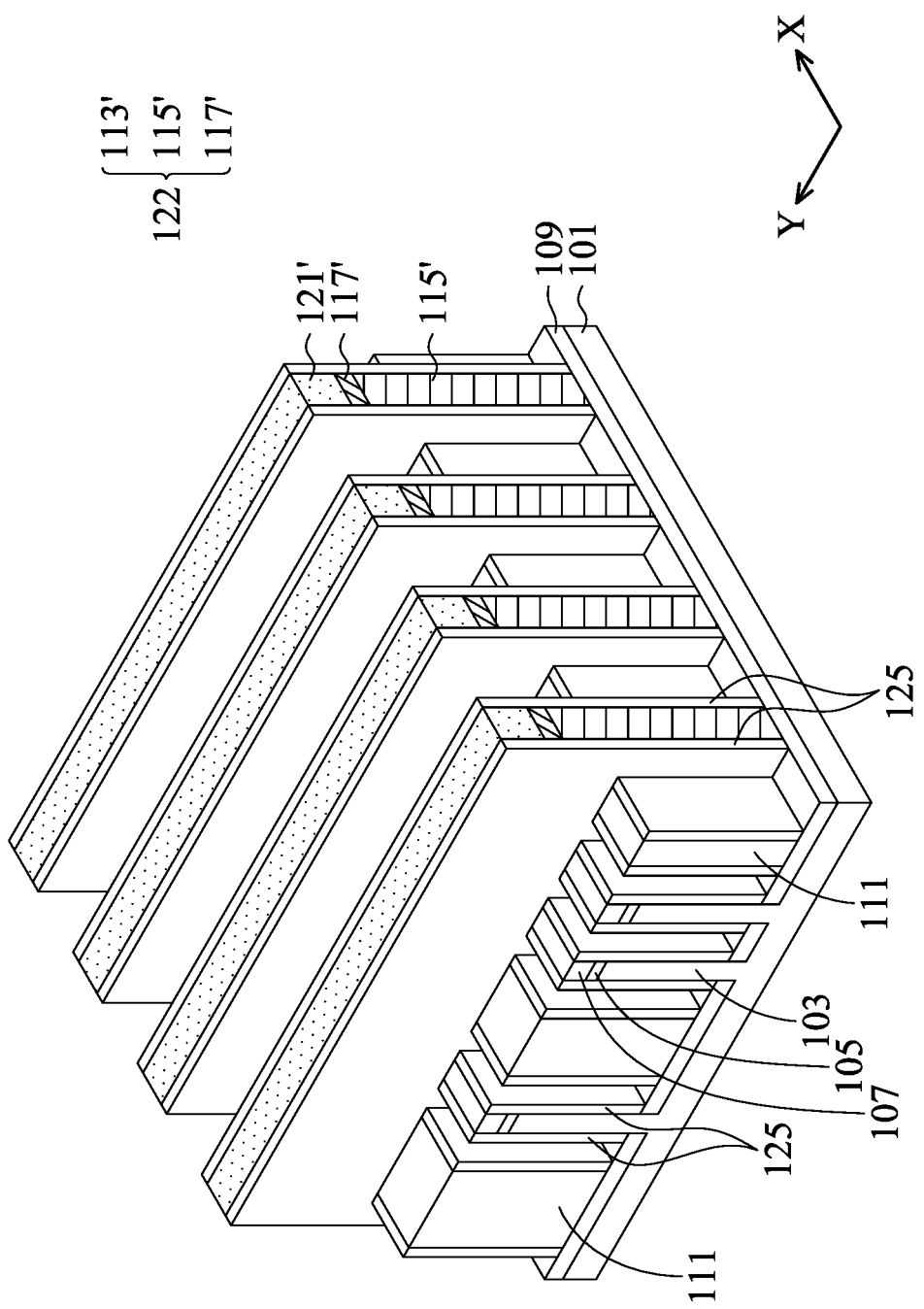

After the metal gate structures 122 and the insulating structure 121' are formed, gate spacers 125 are formed on opposite sidewalls 122S of each of the metal gate structures 122 and opposite sidewalls 121S of each of the extending portions 121a' and 121b', as shown in FIGS. 1F and 1G in accordance with some embodiments. Moreover, in some embodiments, the gate spacers 125 are also formed on opposite sidewalls of each of the fin structures 103 and opposite sidewalls 111S of each of the fin isolation structures 111.

In order to improve the speed of the FinFET device structure 100, the gate spacers 125 are made of low-k dielectric materials. In some embodiments, the low-k dielectric materials have a dielectric constant (k value) less than about 4. Examples of low-k dielectric materials include, but are not limited to, silicon oxide, silicon nitride, silicon carbonitride (SiCN), silicon oxide carbonitride (SiOCN), fluorinated silica glass (FSG), carbon doped silicon oxide, amorphous fluorinated carbon, parylene, bis-benzocyclobutenes (BCB), or polyimide.

In some other embodiments, the gate spacers 125 are made of extreme low-k (ELK) dielectric materials with a dielectric constant less than about 2.5. In some embodiments, ELK dielectric materials include carbon doped silicon oxide, amorphous fluorinated carbon, parylene, bis-benzocyclobutenes (BCB), polytetrafluoroethylene (PTFE) (Teflon), or silicon oxycarbide polymers (SiOC). In some embodiments, ELK dielectric materials include a porous version of an existing dielectric material, such as hydrogen silsesquioxane (HSQ), porous methyl silsesquioxane (MSQ), porous polyarylether (PAE), porous SiLK, or porous silicon oxide ($SiO_2$).

In some embodiments, each pair of the gate spacers 125 may be a single layer or multiple layers. In addition, the method for forming the gate spacers 125 includes depositing a spacer layer (not shown) conformally covering the insulating structure 121', the patterned mask layer 107 over the fin structures 103, the fin isolation structures 111 and the isolation structure 109, and performing an etching process to remove the portions of the spacer layer over the top surfaces of the insulating structure 121', the patterned mask layer 107, the fin isolation structures 111 and the isolation structure 109. Then, the remaining portions of the spacer layer become the gate spacers 125.

In some embodiments, the depositing process of the spacer layer may be a chemical vapor deposition (CVD) process, a physical vapor deposition (PVD) process, a spin coating process, or another applicable process. In some embodiments, the gate spacers 125 cover the sidewalls 121S of the extending portions 121a' and 121b' of the insulating structure 121', and the gate spacers 125 cover the sidewalls 122S of the metal gate structures 122, as shown in FIGS. 1F and 1G. It should be noted that, the sidewalls 121S are coplanar with the sidewalls 122S.

After the gate spacers 125 are formed, source/drain (S/D) structures 127 are formed over the fin structures 103. In some embodiments, portions of the fin structures 103 adjacent to the metal gate structures 122 are recessed to form recesses at two opposite sides of the fin structures 103, and a strained material is grown in the recesses by an epitaxial (epi) process to form the S/D structures 127. In addition, the lattice constant of the strained material may be different from the lattice constant of the substrate 101. In some embodiments, the S/D structures 127 include Ge, SiGe, InAs, InGaAs, InSb, GaAs, GaSb, InAlP, InP, or the like.

After the S/D structures 127 are formed, a contact etch stop layer (CESL) 129 is formed over the isolation structure 109, and an inter-layer dielectric (ILD) structure 131 is formed over the CESL 129. More specifically, the CESL 129 is formed over the S/D structures 127, the fin isolation structures 111, the isolation structure 109, and the sidewalls of the gate spacers 125. In some embodiments, the CESL 129 is made of silicon nitride, silicon oxynitride, and/or other applicable materials. Moreover, the CESL 129 may be formed by plasma enhanced CVD, low-pressure CVD, atomic layer deposition (ALD), or other applicable processes.

In some embodiments, the ILD structure 131 includes multilayers made of multiple dielectric materials, such as silicon oxide, silicon nitride, silicon oxynitride, phosphosilicate glass (PSG), borophosphosilicate glass (BPSG), low-k dielectric material, and/or other applicable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. In addition, the ILD structure 131 may be formed by chemical vapor deposition (CVD), physical vapor deposition, (PVD), atomic layer deposition (ALD), spin-on coating, or another applicable process.

Figure 1H:
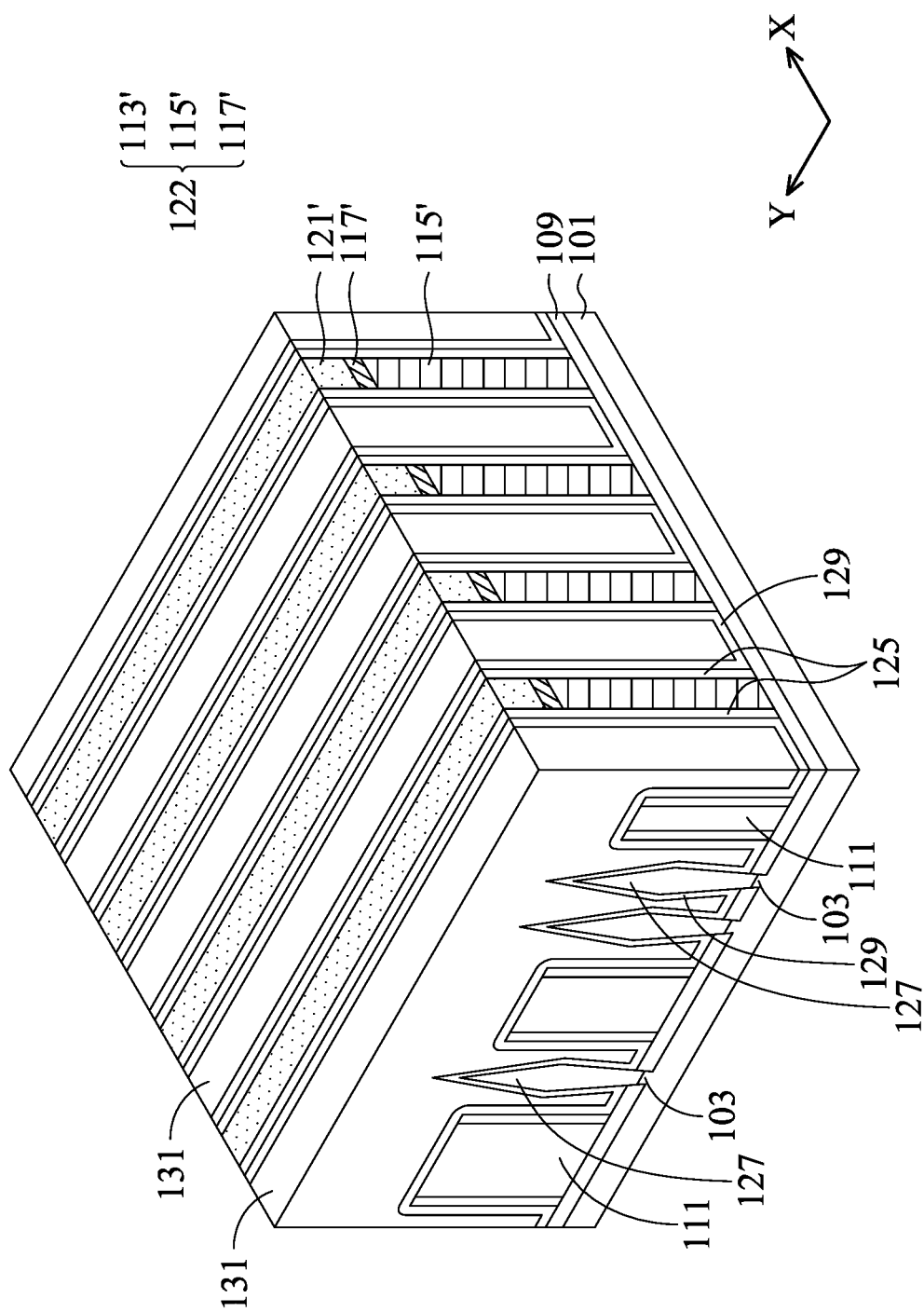

Afterwards, a planarizing process is performed on the ILD structure 131 until the top surfaces of the insulating structures 121' are exposed, as shown in FIG. 1H in accordance with some embodiments. After the planarizing process, the top surfaces of the insulating structures 121' may be substantially level with the top surfaces of the gate spacers 125, the CESL 129, and the ILD structure 131. In some embodiments, the planarizing process includes a grinding process, a chemical mechanical polishing (CMP) process, an etching process, another applicable process, or a combination thereof.

Figure 1I:
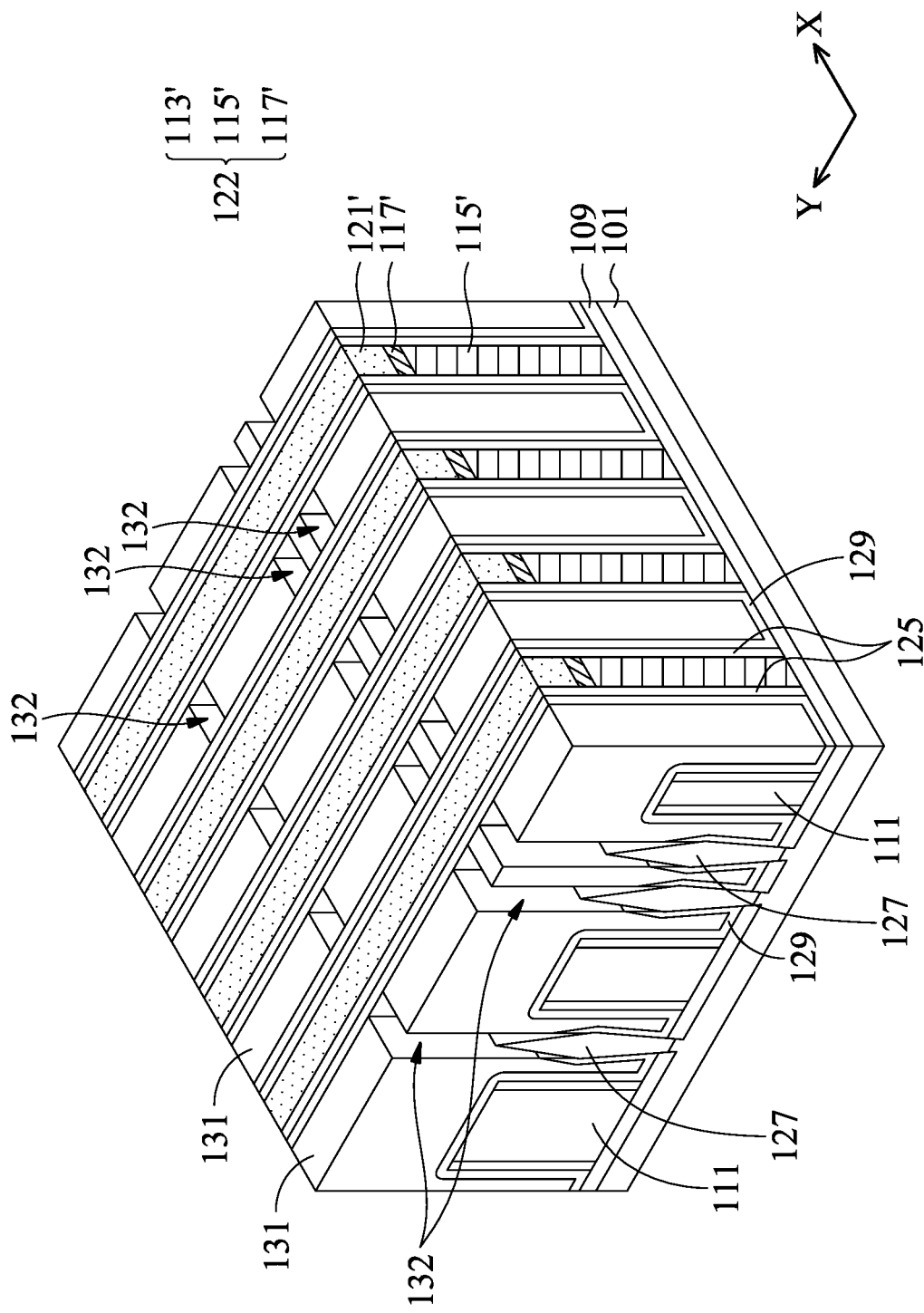

After the ILD structure 131 is formed, a portion of the ILD structure 131 is removed to form contact openings 132, as shown in FIG. 1I in accordance with some embodiments. Specifically, the ILD structure 131 and the CESL 129 are partially removed by an etching process, such as a dry etching process. As a result, a portion of each of the S/D structures 127 is exposed by the contact openings 132.

The insulating structure 121' over the metal gate structures 122 is used as a mask for performing a self-aligned etching process to form the contact openings 132. It should be noted that, the material of the insulating structure 121' is different from the material of the ILD structure 131. In some embodiments, the etching selectivity of the insulating structure 121' with respect to the ILD structure 131 is high. Therefore, the etching process for forming the contact openings 132 is a self-aligned etching process.

More specifically, the portion of the ILD structure 131 is removed by the etching process while the insulating structure 121' is not removed. Since the metal gate structures 122 are protected by the insulating structure 121', the metal gate structures 122 are not damaged by the etchant during the etching process for forming the contact openings 132.

The term of "selectivity" or "etching selectivity" is defined as the ratio of etching rate of one material (the reference material) relative to another material (the material of interest). An increase in etching selectivity means that the selected material, or material of interest, is harder to etch. A decrease in etching selectivity means that the selected material is easier to etch. More specifically, the high etching selectivity of insulating structure 121' means that the insulating structure 121' is not easy to damage or etch during the etching process of the ILD structure 131.

Figure 1J:
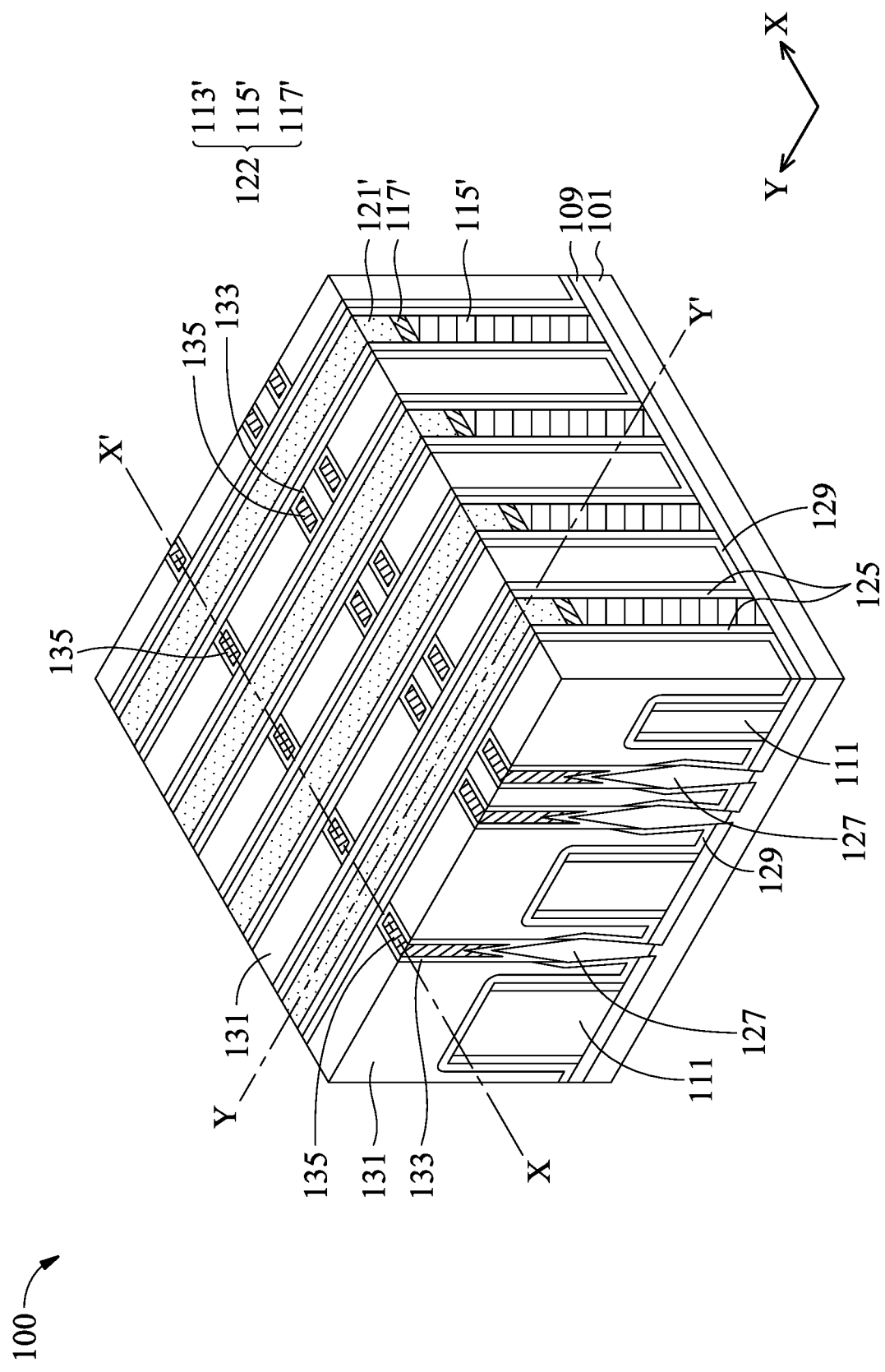

Afterwards, a barrier layer 133 is formed over the bottom surface and the sidewalls of each of the contact openings 132, and a contact 135 is formed over each of the barrier layer 133, as shown in FIG. 1J in accordance with some embodiments. Each of the barrier layers 133 surrounds each of the contacts 135, and the ILD structure 131 surrounds the barrier layers 133. The contacts 135 are electrically connected to the S/D structures 127.

In some embodiments, the barrier layers 133 are made of tantalum (Ta), tantalum nitride (TaN), titanium (Ti), titanium nitride (TiN), cobalt tungsten (CoW) or another applicable material. In some embodiments, the barrier layers 133 are made of Ti/TiN/W, and tungsten (W) in the barrier layers 133 has a smaller grain size than the grain size of the contacts 135 when the contacts 135 are made of tungsten (W). In some embodiments, the barrier layers 133 are formed by a deposition process, such as a chemical vapor deposition (CVD) process, physical vapor deposition (PVD) process, atomic layer deposition (ALD) process, plating process or another application process.

In some embodiments, the contacts 135 are made of tungsten (W), cobalt (Co), titanium (Ti), aluminum (Al), copper (Cu), tantalum (Ta), platinum (Pt), molybdenum (Mo), silver (Ag), manganese (Mn), zirconium (Zr), ruthenium (Ru), or another application material. In some embodiments, the contacts 135 are formed by a deposition process, such as a chemical vapor deposition (CVD) process, a physical vapor deposition (PVD) process, an atomic layer deposition (ALD) process, a plating process, or another application process.

In addition, a glue layer may optionally be formed between each of the barrier layers 133 and each of the contacts 135. The glue layers are used to improve adhesion between the barrier layers 133 and the contacts 135. After the contacts 135 are formed, the FinFET device structure 100 is obtained.

Figure 2A:
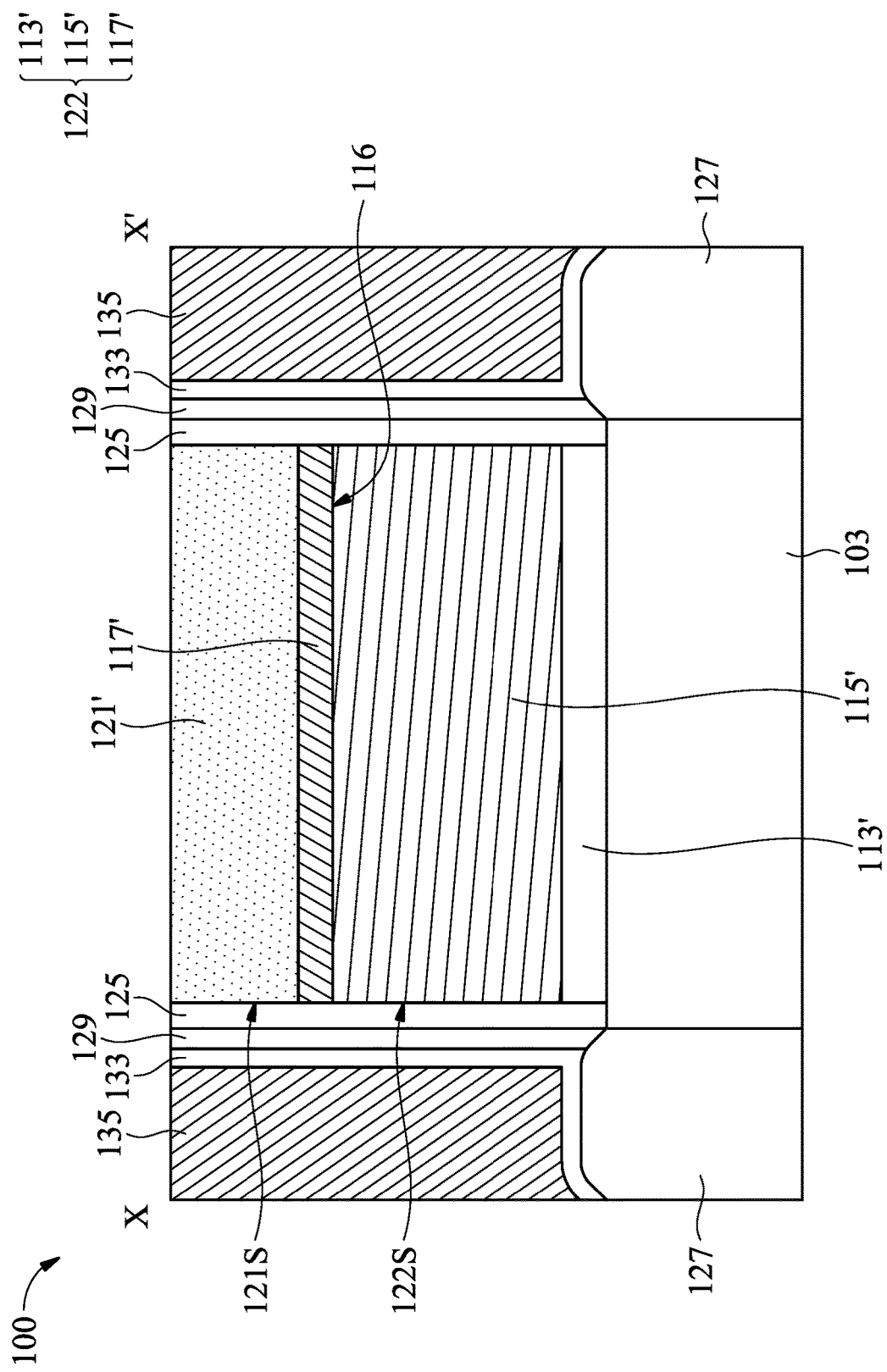
FIGS. 2A and 2B are cross-sectional representations of a FinFET device structure shown in FIG. 1J, in accordance with some embodiments of the disclosure.
Figure 2B:
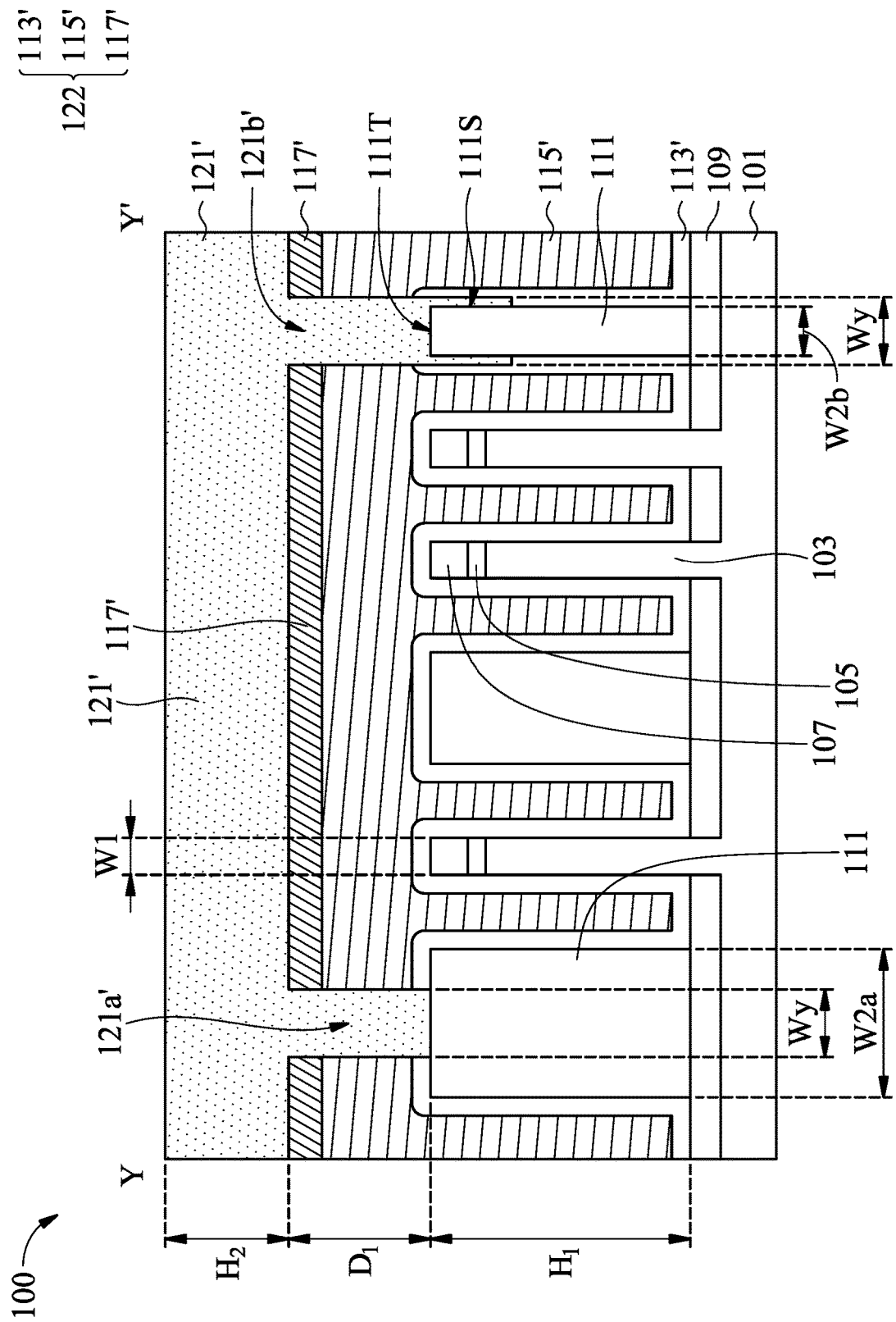

FIGS. 2A and 2B are cross-sectional representations of the FinFET device structure 100 shown in FIG. 1J, in accordance with some embodiments of the disclosure. FIG. 2A is a cross-sectional representation taken along line X-X' of FIG. 1J, and FIG. 2B is a cross-sectional representation taken along line Y-Y' of FIG. 1J.

More specifically, FIG. 2A is a partially cross-sectional representation taken along line X-X' of FIG. 1J. In some embodiments, the interfaces between the fin structures 103 and the S/D structures 127 are coplanar with the interfaces between the gate spacers 125 and the CESL 129. In some embodiments, the interface between the remaining high-k dielectric layer 113' and it should be noted that, the remaining high-k dielectric layer 113', the remaining metal stack 115' and the remaining metal cap layer 117' of the metal gate structure 122 are non-U-shaped. If the metal gate structure 122 includes U-shaped layers, the current of the channel region (i.e. the portion of the fin structure 103 under the metal gate structure 122) directly under the corners of the U-shaped layers may not be easy to control with the metal gate structure 122. In the present embodiment, the metal gate structure 122 has non-U-shaped layers. Therefore, the current of the channel region may be easy to control and the leakage current may be decreased. As a result, the performance of the FinFET device structure 100 may be improved by increasing the on-off current ratio.

In addition, the insulating structure 121' is formed by a depositing process and a patterning process, in accordance with some embodiments. The insulating structure 121' is not formed by filling the dielectric material in the openings above the metal gate structure 122. Therefore, the insulating structure 121' is deposited evenly with no gaps or seams formed inside the insulating structure 121'.

Is some embodiments, the width W1 of the fin structures 103 is in a range from about 3 nm to about 100 nm, as shown in FIG. 2B in accordance with some embodiments. In some embodiments, the fin isolation structures 111 have a width W2a and a width W2b, the width W2a is different from the width W2b. The width W2a is in a range from about 3 nm to about 100 nm, and the width W2b is also in a range from about 3 nm to about 100 nm.

Moreover, the width of the extending portions 121a' and 121b' is substantially the same as the width Wy of the first openings 120a and 120b, as shown in FIGS. 2B and 1C in accordance with some embodiments. As described previously, the width Wy is in a range from about 5 nm to about 80 nm.

It should be noted that, since the width Wy of the extending portion 121b' is greater than the width W2b of the fin isolation structure 111, the extending portion 121b' is in direct contact with the top surface 111T and the sidewalls 111S of the fin isolation structure 111 such that a portion of the extending portion 121b' is sandwiched between the fin isolation structure 111 and the remaining high-k dielectric layer 113'. More specifically, the top portion of the fin isolation structure 111 with the width W2b is surrounded by the extending portion 121b' of the insulating structure 121'.

In some embodiments, the width Wy of the extending portion 121a' is smaller than the width W2a of the fin isolation structure 111. Therefore, the bottommost surface of the extending portion 121a' of the insulating structure 121' is in direct contact with the topmost surface of the fin isolation structure 111.

In addition, the fin isolation structures 111 have a first height $H_1$, and the insulating structure 121' has a second height $H_2$. In some embodiments, the first height $H_1$ is in a range from about 20 nm to about 80 nm, and the second height $H_2$ is in a range from about 5 nm to about 50 nm.

When the second height $H_2$ is too large, the portion of the insulating structure 121' over the metal gate structures 122 may be too thick. Therefore, the etching process of the first openings 120a and 120b may be a big challenge due to high aspect ratios. When the second height $H_2$ is too small, the insulating structure 121' may be too thin such that the metal gate structures 122 may not be fully protected during the self-aligned etching processes.

In the present embodiment, the first openings 120a and 120b are formed penetrating through the high-k dielectric layer 113, the metal stack 115 and the metal cap layer 117, and a dielectric material 121 is formed over the metal cap layer 117 and filling the first openings 120a and 120b. Afterwards, the dielectric material 121, the metal cap layer 117, the metal stack 115 and the high-k dielectric layer 113 are patterned to form the metal gate structures 122 and the insulating structure 121' having the extending portions 121a' and 121b'. Since the width Wx of the first openings 120a and 120b are large enough, and the fin isolation structures 111 are used as an etch stop layer for forming the first openings 120a and 120b, the aspect ratios ($D_1$/Wx), ($D_2$/Wx), ($D_1$/Wy) and ($D_2$/Wy) of the first openings 120a and 120b are small. As a result, the required etch bias may be decreased, and the etching process for forming the first openings 120a and 120b may be easily performed.

Moreover, the S/D structure 127 and the ILD structure 131 are formed after the metal gate structures 122 and the insulating structure 121' are formed. Therefore, the S/D structure 127 and the ILD structure 131 may not be etched during the etching process for forming the first openings 120a and 120b, which is used to form the extending portions 121a' and 121b' of the insulating structure 121'.

In addition, since the insulating structure 121' over the metal gate structures 122 and the metal gate structures 122 are formed in the same process, the insulating structure 121' can be used as a self-aligned contact mask in the subsequent processes. Therefore, an etch back process for forming the self-aligned contact mask has no need to be performed on the metal gate structures 122.

Embodiments of a FinFET device structure and method for forming the same are provided. The method for forming the FinFET device structure includes partially removing the metal stack so that a top surface of the fin isolation structure is exposed, and forming a dielectric material over the metal stack and covering the top surface of the fin isolation structure. The method also includes patterning the dielectric material and the metal stack to form a metal gate structure and an insulating structure over the metal gate structure. Since the metal stack for forming the metal gate structure is deposited prior to the dielectric material, which is used to form the insulating structure over the metal gate structure in the subsequent process, the aspect ratio of the opening filling by the dielectric material may be small enough due to its greater width and smaller depth. As a result, the required etch bias may be decreased, and the etching process for forming the openings may be easily performed.

In some embodiments, A FinFET device structure is provided. The FinFET device structure includes a substrate, a fin structure formed over the substrate, and an isolation structure formed over the substrate. The fin structure protrudes from the isolation structure. The FinFET device structure further includes a fin isolation structure formed over the isolation structure and a metal gate structure formed over the fin structure and the fin isolation structure. In some embodiments, the fin isolation structure is separated from the substrate by the isolation structure. In some embodiments, the FinFET device structure further includes an inter-layer dielectric (ILD) structure formed over the fin structure, the fin isolation structure and the isolation structure. In some embodiments, the FinFET device structure further includes an insulating structure formed over the metal gate structure, wherein an extending portion of the insulating structure is in direct contact with the fin isolation structure. In some embodiments, a sidewall of the metal gate structure is coplanar with a sidewall of the extending portion. In some embodiments, the FinFET device structure further includes a gate spacer formed adjacent to the metal gate structure and the insulating structure, wherein a top surface of the gate spacer is coplanar with a top surface of the insulating structure. In some embodiments, the FinFET device structure further includes a source/drain (S/D) structure formed over the fin structure and a contact etch stop layer (CESL) formed over the S/D structure, the fin isolation structure, and the isolation structure. In some embodiments, the FinFET device structure further includes a barrier layer formed over the S/D structure, and a contact formed over the barrier layer.

In some embodiments, a FinFET device structure is provided. The FinFET device structure includes a substrate, a fin structure formed over the substrate, and a fin isolation structure formed over the substrate and adjacent to the fin structure. The FinFET device structure further includes metal gate structures formed over the fin structure and the fin isolation structure, and an insulating structure formed over the metal gate structures. The metal gate structures are separated by an extending portion of the insulating structure. In some embodiments, an upper portion of the fin isolation structure is surrounded by the extending portion of the insulating structure. In some embodiments, the extending portion of the insulating structure has a first width, and a ratio of a depth of the extending portion to the first width is in a range from about 0.0005 to about 2.5. In some embodiments, the extending portion of the insulating structure has a second width, and a ratio of a depth of the extending portion to the second width is in a range from about 0.0625 to about 20. In some embodiments, the FinFET device structure further includes gate spacers covering sidewalls of the metal gate structures and the sidewalls of the extending portion of the insulating structure. In some embodiments, the FinFET device structure further includes a source/drain (S/D) structure adjacent to the metal gate structures, an etch stop layer covering the S/D structure and a top surface of the fin isolation structure, and an inter-layer dielectric (ILD) structure formed over the etch stop layer.

In some embodiments, a FinFET device structure is provided. The FinFET device structure includes a fin structure formed over a substrate and a metal gate structure formed over the fin structure. The FinFET device structure further includes an insulating structure formed over the metal gate structure, and a gate spacer (125) formed over a sidewall of the metal gate structure and a sidewall of the insulating structure. The sidewall of the metal gate structure is coplanar with the sidewall of the insulating structure. In some embodiments, the FinFET device structure further includes an isolation structure formed over the substrate and a fin isolation structure formed over the isolation structure, wherein the fin structure protrudes from the isolation structure. In some embodiments, an extending portion of the insulating structure is in direct contact with the fin isolation structure. In some embodiments, a width of the extending portion is greater than a width of the fin isolation structure, and a portion of the fin isolation structure is sandwiched by the extending portion. In some embodiments, a width of the extending portion is smaller than a width of the fin isolation structure, and the metal gate structure partially covers the fin isolation structure. In some embodiments, the insulating structure further includes extending portions, wherein the metal gate structure is sandwiched between the extending portions of the insulating structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A fin field effect transistor (FinFET) device structure, comprising:
   a substrate;
   a fin structure formed over the substrate;
   an isolation structure formed over the substrate, wherein the fin structure protrudes from the isolation structure;
   a plurality of fin isolation structures separated from each other and formed over the isolation structure; and
   a metal gate structure formed over the fin structure and the fin isolation structures, wherein the metal gate structure vertically overlaps a top surface of the fin isolation structures.

2. The fin field effect transistor (FinFET) device structure as claimed in claim 1, wherein the fin isolation structures are separated from the substrate by the isolation structure.

3. The fin field effect transistor (FinFET) device structure as claimed in claim 1, further comprising an inter-layer dielectric (ILD) structure formed over the fin structure, the fin isolation structures and the isolation structure.

4. The fin field effect transistor (FinFET) device structure as claimed in claim 1, further comprising an insulating structure formed over the metal gate structure, wherein an extending portion of the insulating structure is in direct contact with the fin isolation structures.

5. The fin field effect transistor (FinFET) device structure as claimed in claim 4, wherein a sidewall of the metal gate structure is coplanar with a sidewall of the extending portion.

6. The fin field effect transistor (FinFET) device structure as claimed in claim 4, further comprising a gate spacer formed adjacent to the metal gate structure and the insulating structure, wherein a top surface of the gate spacer is coplanar with a top surface of the insulating structure.

7. The fin field effect transistor (FinFET) device structure as claimed in claim 1, further comprising:
   a source/drain (S/D) structure formed over the fin structure; and a contact etch stop layer (CESL) formed over the S/D structure, the fin isolation structures, and the isolation structure.

8. The fin field effect transistor (FinFET) device structure as claimed in claim 7, further comprising:
a barrier layer formed over the S/D structure; and
a contact formed over the barrier layer.

9. A fin field effect transistor (FinFET) device structure, comprising:
a substrate;
a fin structure formed over the substrate;
a plurality of fin isolation structures separated from each other and formed over the substrate and adjacent to the fin structure;
metal gate structures formed over the fin structure and the fin isolation structures, wherein the metal gate structures vertically overlap a top surface of the fin isolation structures; and
an insulating structure formed over the metal gate structures, wherein the metal gate structures are separated by an extending portion of the insulating structure.

10. The fin field effect transistor (FinFET) device structure as claimed in claim 9, wherein an upper portion of the fin isolation structures is surrounded by the extending portion of the insulating structure.

11. The fin field effect transistor (FinFET) device structure as claimed in claim 9, wherein the extending portion of the insulating structure has a first width, and a ratio of a depth of the extending portion to the first width is in a range from about 0.0005 to about 2.5.

12. The fin field effect transistor (FinFET) device structure as claimed in claim 9, wherein the extending portion of the insulating structure has a second width, and a ratio of a depth of the extending portion to the second width is in a range from about 0.0625 to about 20.

13. The fin field effect transistor (FinFET) device structure as claimed in claim 9, further comprising gate spacers covering sidewalls of the metal gate structures and the sidewalls of the extending portion of the insulating structure.

14. The fin field effect transistor (FinFET) device structure as claimed in claim 9, further comprising:
a source/drain (S/D) structure adjacent to the metal gate structures;
an etch stop layer covering the S/D structure and the top surface of the fin isolation structures; and
an inter-layer dielectric (ILD) structure formed over the etch stop layer.

15. A fin field effect transistor (FinFET) device structure, comprising:
a fin structure formed over a substrate;
a metal gate structure formed over the fin structure;
an insulating structure formed over the metal gate structure, wherein the insulating structure passes through an opening of the metal gate structure; and
a gate spacer formed over a sidewall of the metal gate structure and a sidewall of the insulating structure, wherein the sidewall of the metal gate structure is coplanar with the sidewall of the insulating structure.

16. The fin field effect transistor (FinFET) device structure as claimed in claim 15, further comprising:
an isolation structure formed over the substrate, wherein the fin structure protrudes from the isolation structure; and
a fin isolation structure formed over the isolation structure.

17. The fin field effect transistor (FinFET) device structure as claimed in claim 16, wherein an extending portion of the insulating structure is in direct contact with the fin isolation structure.

18. The fin field effect transistor (FinFET) device structure as claimed in claim 17, wherein a width of the extending portion is greater than a width of the fin isolation structure, and a portion of the fin isolation structure is sandwiched by the extending portion.

19. The fin field effect transistor (FinFET) device structure as claimed in claim 17, wherein a width of the extending portion is smaller than a width of the fin isolation structure, and the metal gate structure partially covers the fin isolation structure.

20. The fin field effect transistor (FinFET) device structure as claimed in claim 15, wherein the insulating structure further comprises extending portions, wherein the metal gate structure is sandwiched between the extending portions of the insulating structure.

* * * * *